(12) United States Patent
Lee

(10) Patent No.: US 8,598,677 B2
(45) Date of Patent: Dec. 3, 2013

(54) SEMICONDUCTOR DEVICE INCLUDING METAL LINES

(75) Inventor: Sang Soo Lee, Gyeonggi-do (KR)

(73) Assignee: Hynix Semiconductor Inc, Icheon (KR)

( * ) Notice: Subject to any disclaimer, the term of this patent is extended or adjusted under 35 U.S.C. 154(b) by 108 days.

(21) Appl. No.: 12/842,574

(22) Filed: Jul. 23, 2010

(65) Prior Publication Data

US 2011/0169142 A1    Jul. 14, 2011

(30) Foreign Application Priority Data

Jan. 11, 2010   (KR) ........................ 10-2010-0002411

(51) Int. Cl.
*H01L 21/70*    (2006.01)

(52) U.S. Cl.
USPC ............ 257/508; 257/758; 257/E21.575; 257/E21.585; 257/E23.141; 438/622

(58) Field of Classification Search
USPC ............ 257/340, 409, 503, 508, E21.575, 257/E23.141, 758; 438/622, 625, 637, 642, 438/688

See application file for complete search history.

(56) References Cited

U.S. PATENT DOCUMENTS

| | | | |
|---|---|---|---|
| 6,091,150 A * | 7/2000 | Sandhu et al. | 257/758 |
| 6,239,008 B1 * | 5/2001 | Yu et al. | 438/587 |
| 2002/0102835 A1 * | 8/2002 | Stucchi et al. | 438/618 |
| 2004/0169217 A1 * | 9/2004 | Houston | 257/296 |
| 2005/0170632 A1 * | 8/2005 | Shim | 438/622 |
| 2009/0004844 A1 * | 1/2009 | Hsia et al. | 438/626 |
| 2009/0152726 A1 * | 6/2009 | Choi | 257/751 |

FOREIGN PATENT DOCUMENTS

| | | | | |
|---|---|---|---|---|
| KR | 1020050059935 A | | 6/2005 | |
| KR | 1020050071077 A | | 7/2005 | |
| KR | 10-2008-0004305 | * | 1/2008 | ............ H01L 27/115 |
| KR | 1020080004305 A | | 1/2008 | |

* cited by examiner

*Primary Examiner* — A. Sefer
*Assistant Examiner* — Farid Khan

(57) ABSTRACT

Provided are a semiconductor device and a method for manufacturing the same. Since an additional space for forming a shield line is unnecessary, the critical dimension of metal lines is reduced, thereby improving data transfer characteristics, signaling characteristics and noise characteristics of the metal lines. The semiconductor device includes: a plurality of metal lines disposed on the semiconductor device; a plurality of insulation layers disposed on the metal lines; and a plurality of shield lines disposed between the insulation layers.

13 Claims, 5 Drawing Sheets

SEMICONDUCTOR DEVICE INCLUDING METAL LINES

CROSS-REFERENCE TO RELATED APPLICATION

The present application claims priority to Korean patent application number 10-2010-0002411, filed on Jan. 11, 2010, which is incorporated by reference in its entirety.

BACKGROUND OF THE INVENTION

The present invention relates to a semiconductor device and a method for manufacturing the same. More particularly, the present invention relates to a semiconductor device including a metal line and a method for manufacturing the same.

Semiconductor devices are manufactured to operate according to their assigned purposes through depositing/etching material on a silicon wafer and doping of impurities into a predetermined region within a silicon wafer. A representative example of a semiconductor device is a semiconductor memory device. The semiconductor memory device includes a large number of elements (e.g., transistors, capacitors, and resistors) in order to perform an assigned purpose. The respective elements are coupled together through conductive layers to exchange data or signals.

As the fabrication technologies of semiconductor devices have been developed, many efforts have been made to manufacture a larger number of chips on a wafer by increasing the integration density of semiconductor devices. Accordingly, a critical dimension (CD) in a design rule is gradually reduced in order to increase the integration density. Furthermore, semiconductor devices are increasingly required to operate at a higher speed and reduce power consumption.

In order to increase the integration density, it is necessary to reduce the sizes of elements inside the semiconductor devices and reduce the lengths and widths of interconnections which couple the elements together. Moreover, the resistances of interconnections must be small so that electric signals can be transferred with minimal loss within the semiconductor devices through interconnections having narrow widths.

Generally, in a semiconductor device, metal lines are formed on various layers in order to electrically couple elements or interconnections. A contact plug is then formed in order to couple an upper metal line to a lower metal line. Recent studies have been conducted to use copper (Cu), which has a low resistance, as a metal line material, or reduce a pattern density of a metal line itself.

BRIEF SUMMARY OF THE INVENTION

Various embodiments of the invention are directed to providing a semiconductor device and a method for manufacturing the same, in which, since a shield line is formed between metal lines by a self-aligned process, an additional space for forming the shield line is unnecessary and thus the CD of the metal line is reduced, thereby improving data transfer characteristics, signaling characteristics and noise characteristics of the metal lines.

In an embodiment of the present invention, a semiconductor device includes: a plurality of metal lines disposed on a semiconductor device; a plurality of insulation layers disposed on the metal lines; and a plurality of shield lines disposed between the insulation layers. Accordingly, since an additional space for forming the shield line is unnecessary, the CD of the metal line is reduced, thereby improving data transfer characteristics, signaling characteristics and noise characteristics of the metal lines.

The shield line may include tungsten (W), and the insulation layer may include a nitride film. The metal line may include: a metal film formed of aluminum (Al) or copper (Cu); and barrier metal films formed of titanium nitride (TiN) under and above the metal film.

The semiconductor device may further include: an interlayer dielectric layer disposed under the metal line; an etch stop layer disposed on the interlayer dielectric layer; and an oxide film disposed on the etch stop layer. Accordingly, oxide patterns having a predetermined thickness can be easily formed under the metal lines.

The thickness of the oxide film may be substantially equal to the thickness of the insulation layer. Accordingly, the metal line and the shield line can be formed to have the substantially equal height.

Ends of the plurality of shield lines may be coupled together and coupled to a ground contact plug. Accordingly, the plurality of shield lines are easily grounded, thereby improving the shield effect on the metal lines.

In another embodiment of the present invention, a method for manufacturing a semiconductor device includes: forming a plurality of metal lines in a semiconductor device; forming a plurality of insulation layers on an entire surface of the semiconductor device including the metal lines; and forming a plurality of shield lines between the respective insulation layers. Accordingly, since an additional space for forming the shield line is unnecessary, the CD of the metal line is reduced, thereby improving data transfer characteristics, signaling characteristics and noise characteristics of the metal lines.

The forming of the metal lines may include: forming a lower barrier metal film, a metal film, and an upper barrier metal film in the semiconductor device; and etching the upper barrier metal film, the metal film, and the lower barrier metal film by using a photolithography process.

The upper barrier metal film and the lower barrier metal film may include a titanium nitride film, and the metal film may include a tungsten film.

The forming of the shield lines may include: depositing a shield line material on an entire surface of the semiconductor device including the metal lines; etching an upper portion of the deposited shield line material; and forming an interlayer dielectric layer on the metal lines and the shield lines. Accordingly, the shield lines are formed by a self-aligned process, without performing a separate photolithography process.

The etching of the upper portion of the shield line material may include: planarizing the upper portion of the shield line material by a chemical mechanical polishing (CMP) process; and etching the upper portion of the remaining shield line material by an etch-back process. Before depositing the shield line material, the method may further include forming a barrier metal film formed of titanium nitride on an entire surface of the semiconductor device including the metal lines. The height of the shield line may be substantially equal to the height of the metal line.

Before forming the metal lines, the method may further include: forming an interlayer dielectric layer in the semiconductor device; forming an etch stop layer on the interlayer dielectric layer; and forming an oxide film on the etch stop layer.

The thickness of the oxide film may be substantially equal to the thickness of the insulation layer. Accordingly, the lower height of the metal line may be substantially equal to the lower height of the shield line.

The forming of the shield lines may include coupling ends of the respective shield lines together and coupling the ends of the respective shields lines to a ground contact plug. Accordingly, the shield effect on the metal lines can be improved.

The insulation layers may be formed on the top surface and sidewalls of the metal lines and the top surface of the etch stop layer.

The forming of the insulation layers may be performed using a low pressure chemical vapor deposition (LP-CVD) process, and the forming of the insulation layer may include adjusting the critical dimension of the shield line by adjusting the thickness of the insulation layer.

The CD of the shield line and the thickness of the insulation layer may be approximately ⅓ of the critical dimension of the metal line. Accordingly, the shield line can be formed while maintaining the CD of the metal line to the existing level.

DESCRIPTION OF EMBODIMENTS

Description will now be made in detail in reference to the embodiments of the present invention and accompanying drawings. Wherever possible, the same reference numbers will be used throughout the drawings to refer to the same or like elements.

Figure 1A:
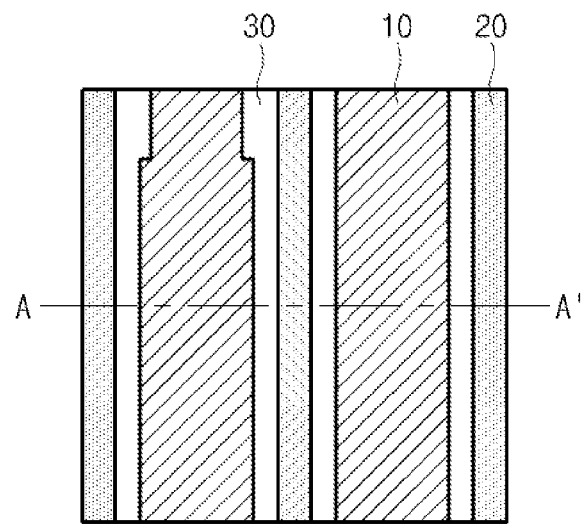
FIGS. 1A and 1B are a plan view and a cross-sectional view of a semiconductor device according to an embodiment of the present invention, respectively.
Figure 1B:
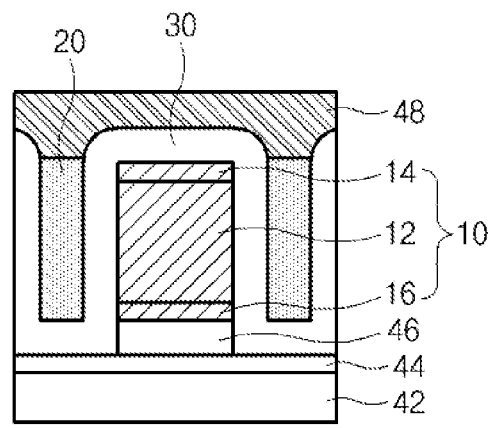

FIGS. 1A and 1B are a plan view and a vertical cross-sectional view of a semiconductor device according to an embodiment of the present invention. Specifically, FIG. 1B is a cross-sectional view taken along line A-A' of FIG. 1A. Referring to FIG. 1A, the semiconductor device according to the embodiments of the present invention includes a plurality of metal lines 10 formed in line and space patterns. FIG. 1A shows the metal lines 10 for references, though the metal lines 10 are below the insulation layers 30. In an embodiment, the semiconductor device is a semiconductor memory device, e.g., a DRAM, NAND, or NOR device. In an embodiment, the metal lines 10 are interconnects formed over memory cells, e.g., transistors (not shown), to connect one part of the semiconductor device to another part of the semiconductor. The metal lines 10 include aluminum, copper, or tungsten depending on implementation. Insulation layers 30 having a predetermined width are formed on sidewalls of the metal lines 10. A shield line 20 is formed in a space defined by the insulation layers 30 between the metal lines 10.

The metal lines 10 electrically couple elements or interconnections and serve as data lines through which data are transmitted. The shield line 20 is formed between the metal lines 10 in order to prevent a fatal malfunction caused by coupling, interference or noise between the adjacent metal lines 10. If the shield line 20 is formed among all the metal lines 10, the area of the semiconductor device would significantly increase. Therefore, the shield line 20 is formed among the important metal lines 10 in an embodiment of the present invention.

Referring to FIG. 1B, the metal line 10 may include a metal film 12 and barrier metal films 14 and 16 disposed under and above the metal film 12. The metal film 12 may include aluminum (Al) or copper (Cu), and the barrier metal films 14 and 16 may include titanium nitride (TiN). An oxide film 46 is formed under the metal line 10. The oxide film 46 is formed to have a thickness substantially equal to that of the insulation layer 30. Consequently, the height of the metal line 10 may coincide with the height of the shield line 20.

An interlayer dielectric layer 42 and an etch stop layer 44 are formed under the metal line 10. The interlayer dielectric layer 42 may include an oxide, and the etch stop layer 44 may include a nitride.

The insulation layer 30 is deposited on the entire surface of the metal line 10, including the sidewalls and the top surface. The insulation layer 30 insulates the adjacent metal lines 10 from each other, provides a space where the shield line 20 is to be formed between the adjacent metal lines 10, and insulates the adjacent metal lines 10 from the shield line 20. The insulation layer 30 may be formed of nitride. The thickness of the insulation layer 30 may be formed approximately ⅓ of the CD of the metal line 10. In this case, the shield line 20 can be formed to have a CD corresponding to approximately ⅓ of a CD of the metal line 10 so that a device space size between lines, i.e., the metal line 10, is substantially the same as the line size. However, each of the insulation layer 30 and the shield line 20 does not necessarily have a width ⅓ of the metal line 10 so long as the space, where the insulation layer 30 and the shield line 20 are formed, has substantially the same width as the metal line 10. An additional element can be further formed in the line area or in the space according to implementation.

After the insulation layer 30 is deposited, the shield line 20 fills a space between the insulation layer 30. The shield line 20 may include tungsten (W). When the height of the shield line 20 is substantially equal to the height of the metal line 10, coupling, interference or noise between the adjacent metal lines 10 can be significantly reduced.

FIGS. 2A to 2F are cross-sectional views illustrating a method for manufacturing a semiconductor device according to an embodiment of the present invention. A method for manufacturing the semiconductor device having the above-described structure will be described below with reference to FIGS. 2A to 2F.

Figure 2A:
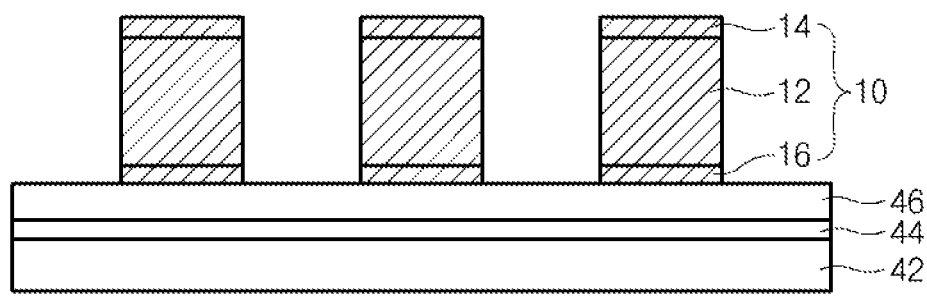
FIGS. 2A to 2F are cross-sectional views illustrating a method for manufacturing a semiconductor device according to an embodiment of the present invention.

Referring to FIG. 2A, an interlayer dielectric layer 42, an etch stop layer 44, and an oxide film 46 are sequentially deposited in order to form a lower interlayer material of a metal line. The interlayer dielectric layer 42 and the oxide film 46 may be formed of oxide, and the etch stop layer 44 may include a nitride film having a different etch selectivity from the oxide film and can be formed ith a thickness of approximately 100 Å. The oxide film 46 may be formed to a thickness corresponding to approximately ⅓ of a CD of a metal line 10.

A metal line 10 is formed on the oxide film 46. The metal line 10 includes a lower barrier metal film 16, a metal film 12, and an upper barrier metal film 14 sequentially formed on the oxide film 46. The metal film 14 may include aluminum (Al) or copper (Cu), and the barrier metal films 14 and 16 may include titanium nitride (TiN).

In a case where the metal film 12 is formed of aluminum (which can be easily etched), a metal line pattern may be formed by sequentially stacking a TiN film, an Al film, and a TiN film and etching the three material films using a photo-lithography process. In a case where the metal film 12 is formed of copper (which is not easily etched), a Damascene process may be used. Specifically, an interlayer dielectric layer (not shown) is formed to a thickness corresponding to a thickness of the metal line 10, and the interlayer dielectric layer is etched to form a recess (not shown) where the metal line 10 is to be formed. Then, the barrier metal film 14, the metal film 12, and the barrier metal film 16 are sequentially formed within the recess.

The metal line 10 is formed in a line and space pattern. In this case, a line to space ratio may be 1:1.

Figure 2B:
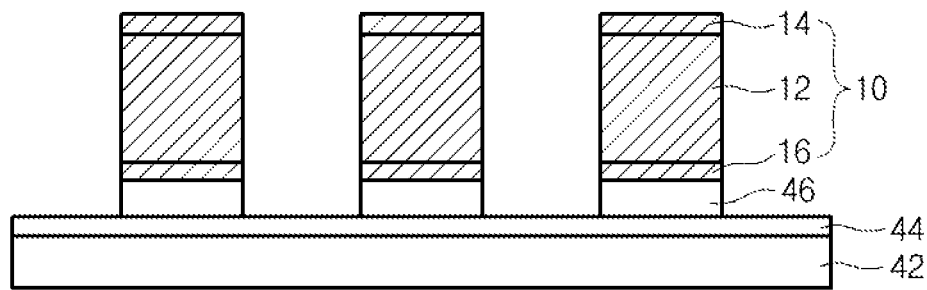

Referring to FIG. 2B, the oxide film 46 under the metal line 10 is etched and removed in a space between the metal lines 10. The etching process may use a reactive ion etch (RIE) process and may be targeted to the etch stop layer 44.

Figure 2C:
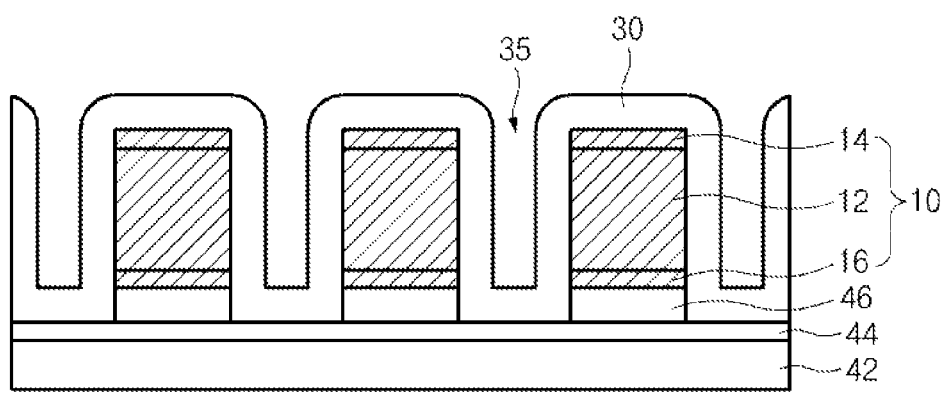

Referring to FIG. 2C, an insulation layer 30 is deposited on the entire pattern including the metal lines 10 and the oxide film 46. The insulation layer 30 may include a nitride film and can be deposited on the entire surface, including the top surfaces and sidewalls of the metal lines 10, sidewalls of the oxide film 46, and the surface of the etch stop layer 44. The thickness of the insulation layer 30 may be formed substantially equal to the thickness of the oxide film 46, and the insulation layer 30 may be formed to have a thickness corresponding to approximately ⅓ of a line CD, i.e., the width of the metal line 10, so that the recess 35 having a width that is a third of the line CD, i.e., the width of the metal line 10, is formed between the insulation layers 30. In the process of depositing the insulation layer 30, the insulation layer 30 may be formed of a lining pattern having substantially the same thickness over the metal line 10 by using a low pressure chemical vapor deposition (LP-CVD) process.

Figure 2D:
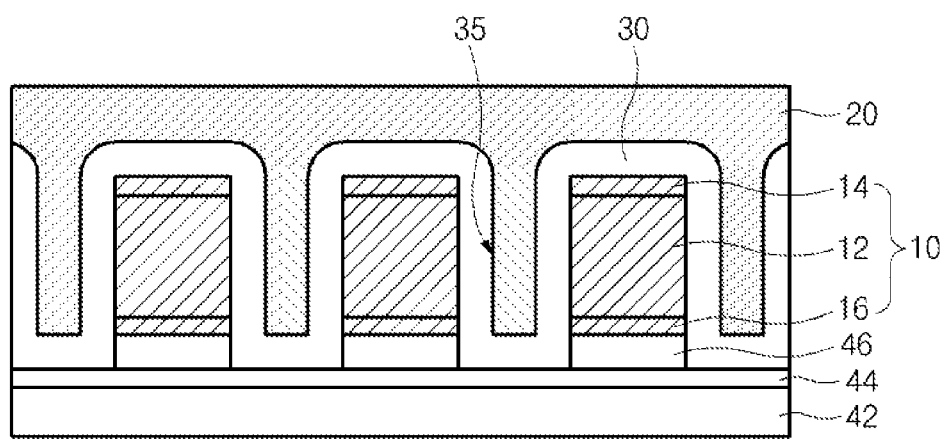

Referring to FIG. 2D, the recess 35 is filled by depositing a shield line material between the insulation layer 30. The shield line material is formed of a conductive material, e.g., tungsten (W), aluminum, (Al), copper (Cu), doped polysilicon, or the like. Although not shown, titanium nitride (TiN) approximately 50-Å thick may be deposited as a barrier metal between the shield line 20 and the insulation layer 30.

In an embodiment, the recess 35 is formed between the insulation layers 30 and the shield line 20 is provided within the recess 35 using a self-aligned process, i.e., a separate photolithography mask is not required. Since an additional expensive photolithography process is not needed, the manufacturing cost of a semiconductor device can be reduced.

Figure 2E:
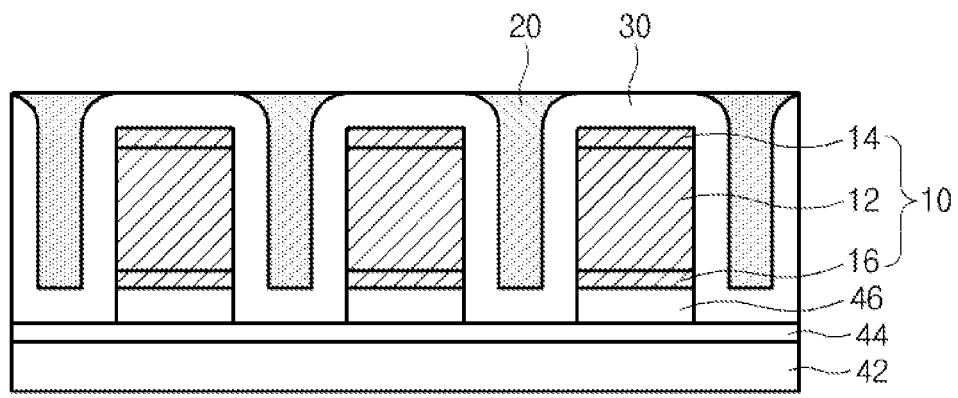

Referring to FIG. 2E, the shield line material on the insulation layer 30 is planarized by a chemical mechanical polishing (CMP) process or an etch-back process targeted to the insulation layer 30.

Figure 2F:
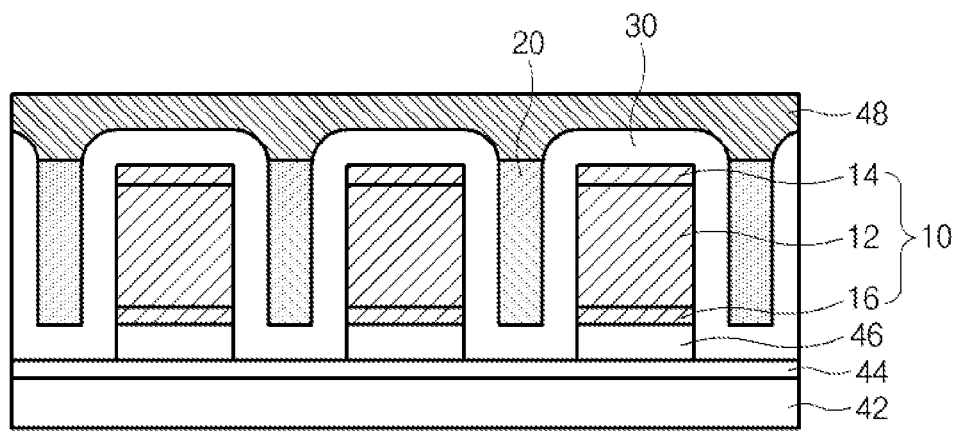

Referring to FIG. 2F, an etch-back process is performed on the shield line material so that the height of the shield line 20 coincides with the height of the metal line 10. An interlayer insulation layer 48 is deposited over the shield line 20 and the metal line 10. Consequently, the process of forming a 1-layer metal line 10 is completed. Another metal line may be formed on the metal line 10, and the above-described processes may be equally applied.

In the method for manufacturing the semiconductor device according to an embodiment of the present invention, the insulation layers 30 are formed on the surfaces of the metal interconnects 10, and the shield line 20 is formed between the insulation layers 30. Therefore, the width of the shield line 20 may be adjusted by the width of the insulation layer 30.

Figure 3:
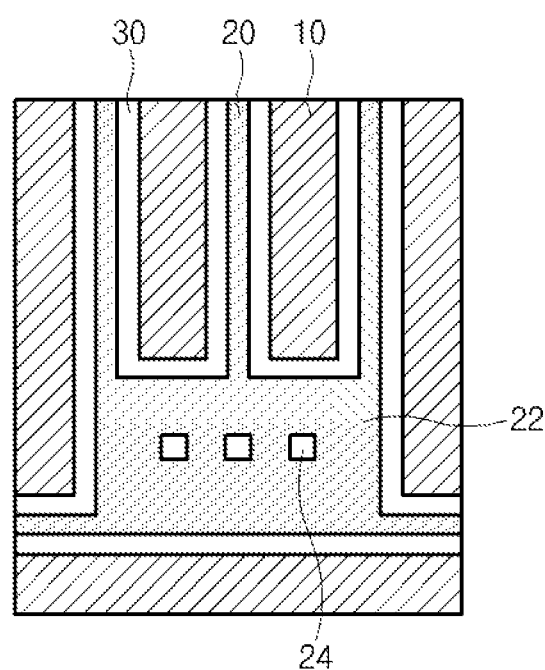
FIG. 3 is a plan view of the semiconductor device according to the embodiment of the present invention.

Meanwhile, FIG. 3 is a horizontal cross-sectional view of the semiconductor device according to the embodiment of the present invention as shown in FIG. 1A. Referring to FIG. 3, ends of the plurality of shield lines 20 are coupled together to form a joining pattern 22. The joining pattern 22 may be electrically coupled to a ground contact plug 24. The ground contact plug 24 is electrically coupled to a ground voltage. The shield line 20 performs no data transmission and serves to shield the metal lines 10 from one another. Thus, if a plurality of shield lines 20 are grounded together, the shield effect for the metal lines 10 can be further improved. In an embodiment, the shield line 20 is employed to reduce interference between metal lines 10, but the shield line 20 may be used to reduce interference between other lines.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   first and second line shaped patterns disposed over a substrate, the first and second line shaped patterns defining a recess therebetween and being electrically isolated from each other;
   an insulation layer formed conformally over the recess; and
   a shield line filling the entire recess between the first and second line shaped patterns, an upper surface of the shield line being provided at substantially the same level as upper surfaces of the first and the second line shaped patterns, respectively,
   wherein the insulating layer electrically isolates the first and the second line shaped patterns from the shield line, and
   wherein the each of the first and second line shaped patterns includes:
   an oxide film; and
   a metal line disposed over the oxide film.

2. The semiconductor device according to claim 1, wherein the shield line comprises tungsten (W).

3. The semiconductor device according to claim 1, wherein the insulation layer comprises nitride.

4. The semiconductor device according to claim 1, wherein each of the first and the second line shaped patterns further comprises:
   a metal film comprising any of aluminum (Al) and copper (Cu); and
   lower and upper barrier metal films comprising titanium nitride (TiN) and provided under and above the metal firm, respectively,
   wherein the upper barrier metal film is disposed between the metal film and the insulating layer.

5. The semiconductor device according to claim 1, further comprising:
   an interlayer dielectric layer disposed below the first line shaped pattern; and
   an etch stop layer disposed between the interlayer dielectric layer and the first line shaped pattern.

6. The semiconductor device according to claim 1, wherein a thickness of each of the oxide film is substantially equal to a thickness of the insulation layer.

7. The semiconductor device according to claim 1, wherein the shield line is electrically coupled to a ground voltage.

8. The semiconductor device according to claim 1, wherein each of the first and the second line shaped patterns is formed in a line and space pattern.

9. The semiconductor device according to claim 8, wherein a ratio of the line and space pattern is substantially 1 to 1.

10. The semiconductor device according to claim 1, wherein a width of the shield line is substantially equal to one third of a width of the first line shaped pattern, and
    wherein a thickness of the insulation layer is substantially equal to one third of the width of the first line shaped pattern.

11. The semiconductor device according to claim 5, wherein the insulation layer is formed (i) over a top surface and sidewalls of each of the first and the second line shaped patterns, and (ii) over a top surface of the etch stop layer.

12. The semiconductor device according to claim 1, wherein the first and the second line shaped patterns are formed to substantially the same level, and
   wherein the first line shaped pattern extends in a direction that is parallel to the second line shaped pattern.

13. The semiconductor device according to claim 1, wherein the shield line is configured to perform no data transmission and further configured to shield the first line shaped pattern from the second line shaped pattern.

* * * * *